United States Patent [19]
Watrous

[11] 3,836,824
[45] Sept. 17, 1974

[54] MOUNTING ARRANGEMENT FOR FLEXIBLE CIRCUIT

[75] Inventor: Donald L. Watrous, Liverpool, N.Y.

[73] Assignee: General Electric Company, Schenectady, N.Y.

[22] Filed: Oct. 24, 1972

[21] Appl. No.: 299,657

[52] U.S. Cl. ............ 317/101 F, 95/11 R, 339/17 F, 339/176 MP
[51] Int. Cl. ............ H05k 1/04
[58] Field of Search... 95/11 L; 317/101 F, 101 CN; 339/176 MF, 17 F

[56] References Cited

UNITED STATES PATENTS

| | | | |
|---|---|---|---|
| 3,582,865 | 1/1971 | Franck et al. | 317/101 F |
| 3,602,870 | 8/1971 | Willard | 339/17 F |
| 3,629,787 | 12/1971 | Wilson | 339/176 MF |
| 3,745,895 | 7/1973 | Brandt et al. | 95/11 R |
| 3,747,489 | 7/1973 | Brandt et al. | 95/11 R |
| 3,748,980 | 7/1973 | Brandt | 95/11 R |

FOREIGN PATENTS OR APPLICATIONS

| | | | |
|---|---|---|---|
| 1,506,553 | 11/1967 | France | 339/176 MF |

*Primary Examiner*—David Smith, Jr.
*Attorney, Agent, or Firm*—Norman C. Fulmer; Lawrence R. Kempton; Frank L. Neuhauser

[57] ABSTRACT

A flexible electrical circuit arrangement, comprising a strip-like member carrying circuitry thereon, is folded around the edge of a support member and attached thereto, resulting in a compact space-saving arrangement. In a preferred embodiment, the circuit is a sequential flashing circuit for sequentially firing a plurality of photoflash lamps, and the support member is an elongated shoulder of a socket for receiving an array of flash lamps. The flexible circuit is elongated and is provided with openings near the ends thereof, which openings engage with posts on opposite sides of the support member for attaching the folded circuit.

14 Claims, 3 Drawing Figures

MOUNTING ARRANGEMENT FOR FLEXIBLE CIRCUIT

BACKGROUND OF THE INVENTION

The invention is in the field of mounting and supporting strip-like flexible electrical circuits, and is particularly useful in mounting and attaching a strip-like flexible sequential flashing circuit, for sequentially flashing a plurality of photoflash lamps, to a socket for receiving an array of such flash lamps.

U.S. Pat. No. 3,670,639 to John Harnden, "Flexible Electronic Integrated Circuit Camera Control Assembly" (assigned the same as this invention), discloses a strip-like flexible sequential flashing circuit arrangement, for sequentially flashing a plurality of flash lamps, which flexible circuit arrangement is attached to a socket for receiving an array of flash lamps, the flexible circuit arrangement being bent into a configuration to fit a desired space. The flexible circuit arrangement may comprise an integrated circuit "chip" carried on a strip-like flexible support member which also carries electrical conductors for connecting the integrated circuit to a lamp-array socket and to a source of operating voltage, and which may also carry discrete circuit elements such as resistors. U.S. Pat. No. 3,676,045 to Donald Watrous and Paul Coté, "Sequencing Static Electronic Flashing Circuits for Photoflash Lamp Array" (assigned the same as this invention), discloses suitable electronic circuits for sequentially flashing the lamps of a photoflash lamp array, one at a time, each time a flash picture is taken. U.S. Pat. Nos. 3,598,984 to Stanley Slomski, "Photoflash Lamp Array" and 3,598,985 to John Harnden and William Kornrumpf, "Construction of Disposable Photoflash Lamp Array" (both assigned the same as this invention), disclose suitable plug-in arrays of flash lamps.

SUMMARY OF THE INVENTION

Objects of the invention are to provide an improved arrangement of mounting a flexible electrical circuit strip to a support member, and particularly for mounting a flexible photoflash sequencing circuit strip to a socket for receiving an array of flash lamps.

The invention comprises, briefly and in a preferred embodiment, a flexible strip-like electrical circuit, and a support member having two opposed surfaces joined by an edge, said flexible circuit strip being folded around said edge and against said two surfaces, and means attaching said circuit to said two surfaces. In a preferred embodiment, the circuit is adapted to sequentially fire a plurality of photoflash lamps contained in an array of such lamps, and the support member comprises an elongated shoulder of a socket for receiving the array of flash lamps. The flexible circuit strip is provided with openings near the ends thereof, and the shoulder is provided with posts on opposite sides thereof for engaging with said openings of the circuit strip when it is folded around the edge of the shoulder and against said opposite sides of the shoulder, thereby holding the circuit in place on the socket. The posts may be peened or flattened to provide secure attachment. Conductor runs on the circuit strip, which are connected to an integrated circuit chip carried on the flexible strip, mate with connection terminals on the socket, and these mating parts are soldered together. One of said surfaces of the socket shoulder may be provided with an opening for accommodating the integrated circuit chip, whereby the circuit strip can be arranged with its integrated circuit chip and conductor runs on the inside, i.e., between the shoulder surfaces and the flexible strip, for protection against damage and to provide electrical insulation for the circuit.

DESCRIPTION OF THE PREFERRED EMBODIMENTS

Figure 1:
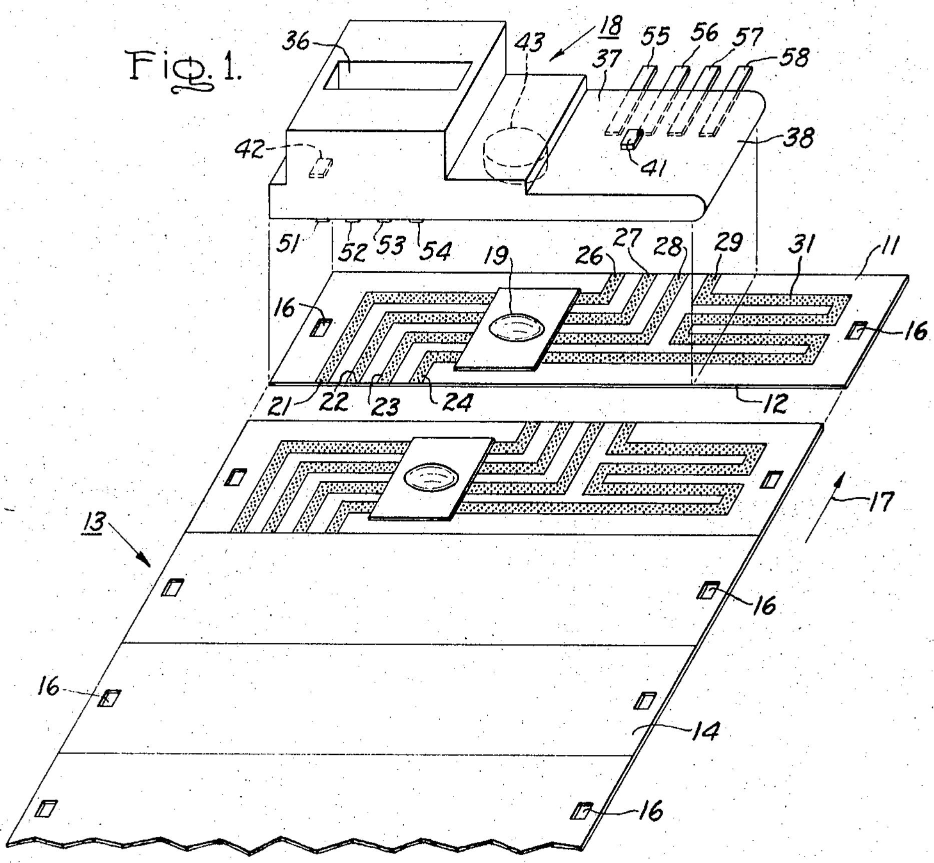
FIG. 1 is a perspective view of a photoflash array socket, and a flexible circuit strip that has been sliced from a roll containing a plurality of such circuits.

In FIG. 1, a flexible circuit strip 11 has been cut along an edge 12 from a roll 13 containing a plurality of electrical circuits, one after the other, carried on a flexible support member 14 of electrically insulating material, preferably an organic resin such as Mylar or a polyimide such as Kapton. The roll 13 of circuits may be, for example, 70 millimeters wide, and wound on a reel similar to 70 millimeter motion picture film, and is provided with a plurality of sprocket openings 16 spaced apart along both edges thereof, for engagement with sprocket wheels for reeling or unreeling the roll of circuits, and for moving them in a direction indicated by the arrow 17 so that the circuit strips 11 may be sheared or cut off from the roll, one after another, so as to be ready for attachment to a photoflash array socket 18, as will be described. In the arrangement shown, the sprocket openings 16 are arranged so that there will be a pair of them, one near each end of the flexible circuit 11, and centered on the flexible strip 11 with respect to the width thereof.

An integrated circuit chip 19 is carried on the flexible strip 11. A plurality of electrical conductor runs 21 through 24 are carried on the flexible strip 11, and extend from electrical contact with the integrated circuit 19, outwardly to the edge 12 of the flexible strip 11 and terminate in positions to respectively mate with connector terminals of the socket 18 as will be described. A plurality of additional connector runs 26 through 29 are carried on the flexible strip 11, for electrically connecting the integrated circuit 19 to external means such as a source of operating voltage, a source of trigger signal for initiating actuation of the printed circuit 19 for causing it to flash a flash lamp, and an output signal lead for causing a camera shutter to close upon completion of the flashing of a flash lamp. In the embodiment shown, a resistor 31 is arranged in a zig-zag configuration and carried on the flexible strip 11, and is connected electrically between the connector run 29 and the integrated circuit 19. The integrated circuit 19 may comprise one of the circuits disclosed in the above-referenced Watrous and Coté patent, and the resistor 31 is the current-sensing resistor 16 shown in FIGS. 1, 2 and 3 of the same patent. Further construction details of the flexible circuit strip 11 are given in the above-referenced Harnden patent.

The socket 18 is provided with a slot-like opening 36 for receiving the plug-in connector tab of an array of flash lamps, such as the type described in the above-referenced patents to Slomski and to Harnden and Kornrumpf. The socket 18 is provided with an elongated shoulder 37, preferably of the same width as that of the flexible circuit strip 11, and the shoulder is provided with a rounded edge 38 at the end thereof, which edge joins the substantially flat and mutually parallel upper and lower surfaces of the shoulder, it being noted that the lower surface of the shoulder is coextensive with and includes the entire lower surface of the socket. A circuit attachment post 41 extends upwardly from the upper surface of the shoulder 37, and another circuit attachment post 42 extends downwardly from the lower surface of the socket, as shown.

Figure 2:
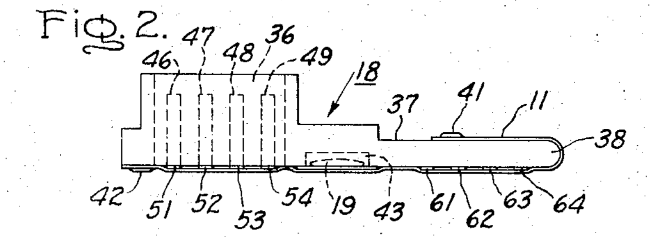
FIG. 2 is a side view of the photoflash array socket, with the flexible circuit attached thereto.
Figure 3:
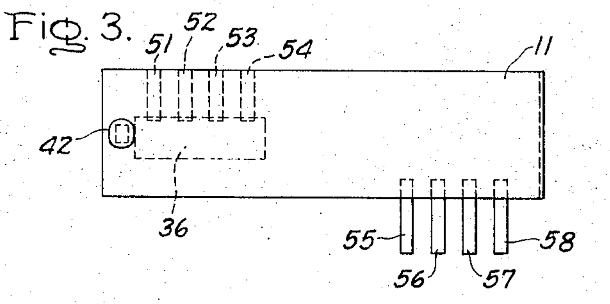
FIG. 3 is a bottom view of the arrangement shown in FIG. 2.

The flexible circuit 11 is attached to the socket 18 by folding the circuit around the edge of the shoulder, and placing the openings 16 respectively over and around the mounting posts 41 and 42, as shown in FIGS. 2 and 3. Preferably the body of the socket 18 is made of plastic material, and after the flexible circuit 11 is folded into position, the plastic posts 41 and 42 are peened or flattened or otherwise deformed, such as by the use of pressure, heat, or ultrasonic vibration, so as to secure the ends of the flexible circuit strip 11 in place respectively at the top and bottom of the socket 18. The openings 16 and posts 41, 42 are spaced so the mounted circuit strip 11 fits snugly against the shoulder 37. The openings 16 need not be sprocket holes, but may be other holes provided through the strip, or may comprise notches in the side edges (edge 12 and the opposite edge) in which case the posts 41 and 42 each would be replaced by a plurality of posts arranged to engage with the notch openings. An opening 43 is provided at the underside of the socket 18, for accommodating the integrated circuit chip 19 when the flexible circuit 11 is in place on the socket 18, as shown in FIG. 2.

The socket 18 is provided with a plurality of resilient electrical contact fingers 46 through 49, arranged to electrically and mechanically engage conductor runs on the plug-in tab of a photoflash lamp array, as is more fully shown and described in the above-referenced Harnden patent. The contact fingers 46 through 49 are shaped and arranged so as to have terminal portions 51 through 54 spaced apart along the underside of the socket 18, so as to respectively mate against the conductor runs 21 through 24 on the flexible circuit strip 11. A plurality of external connecting terminals 55 through 58 are carried by the socket 18, at the shoulder 37 thereof, and terminate at connector sections 61 through 64 at the underside of the socket 18 arranged to respectively mate against the end regions of the conductor runs 26 through 29. All of the end regions of the conductor runs 21 through 24 and 26 through 29 on the flexible circuit strip 11 are then respectively soldered or otherwise attached to the terminal areas 51 through 54 and 61 through 64 at the socket 18. This can be readily accomplished by previously solderplating these areas, and then, after the flexible circuit strip 11 has been attached to the socket 18 as shown in FIGS. 2 and 3, placing a hot flat soldering tool against the underside of the circuit strip 11, whereby heat flows through the material of the strip 11 sufficiently to solder the respective contact runs to the respectively mated socket terminal areas. Instead of soldering, the connections may be welded, cemented, etc.

While only four conductor runs 21–24 are shown in the drawing, any desired number of them may be employed for making suitable connections to the flash lamp array intended to be used with the arrangement. For a flash lamp array having five flash lamps per side, as disclosed in the above-referenced flash lamp array patents, there would be at least six, instead of four, conductor runs for connection to a similar number of socket contact fingers at the slot 36.

Preferably the integrated circuit 19 and all of the conductor runs and printed resistor 31, are all on one side of the circuit strip 11, both for ease of manufacture, and so that the circuit strip can be folded around the shoulder 37 of the socket 18 with all of the circuit elements on the inside, i.e., sandwiched between the socket body and the electrically insulating material of the strip 11, thereby protecting these elements from mechanical damage, and also serving to electrically insulate them from any external metallic objects.

Instead of providing the external circuit connection terminals 55 through 58 on the socket 18, the circuit strip 11 may be provided with a laterally extending portion, with the external conductor runs 26 through 29 extending thereon laterally outwardly from the socket 18, so as to be exposed for soldering to the external circuit connections. In a refinement of the circuit fabrication, the relatively longer conductor runs 21 and 22 can be made proportionately wider than the shorter runs 23 and 24, so that the resistance of all these runs, though very low, will be of equal value, thus insuring equal amounts of firing current energy applied to each of the lamps as they are sequentially flashed by the circuit.

The invention achieves its objective of providing a secure and compact arrangement for attaching a flexible electrical circuit to a support means, and does so by means of a method which is quick and economical to manufacture.

While preferred embodiments of the invention have been shown and described, various other embodiments and modifications thereof will become apparent to persons skilled in the art, and will fall within the scope of invention as defined in the following claims.

What I claim as new and desire to secure by Letters Patent of the United States is:

1. An arrangement for holding an array of photoflash lamps and for sequentially firing the flash lamps of the array, comprising a socket having a plurality of connector means adapted to have said array of photoflash lamps connected thereto, and a flexible sheet-like electrical circuit provided with openings therethrough toward opposite ends thereof and comprising an electronic circuit for sequentially firing the flash lamps of said array, said socket being provided with a shoulder comprising two opposed surfaces joined at an edge thereof and having posts extending respectively from said surfaces, said flexible circuit being positioned to fold around said edge and against said surfaces, said openings being respectively positioned to engage with said posts thereby positioning said circuit on said shoulder, and means electrically connecting said electronic circuit with said plurality of connector means.

2. A combination as claimed in claim 1, in which the ends of said posts are deformed to overlie the edges of said openings thereby securing said circuit to said shoulder.

3. A combination as claimed in claim 1, in which said flexible circuit is in the form of an elongated strip, in which said opposed surfaces are substantially flat and mutually parallel, and in which said edge is shaped to provide a convexly curved transition from one to the other of said surfaces.

4. A combination as claimed in claim 3, in which the width of said opposed surfaces of the shoulder are substantially equal to each other and to the width of said flexible circuit elongated strip.

5. A combination as claimed in claim 1, in which said socket is provided with a top surface and a bottom surface and is provided with a slot extending downwardly from the top surface thereof and adapted to receive a connector tab of said flash lamp array, said plurality of connector means being positioned at said slot for being electrically connected to said connector tab and respectively terminating in terminal portions at said bottom surface of the socket, said flexible circuit including conductor runs respectively mated against said terminal portions of the connector means.

6. A combination as claimed in claim 5, in which said mated conductor runs and terminal portions are respectively soldered together.

7. A combination as claimed in claim 5, in which said bottom surface of the socket is coextensive with one of said opposed surfaces of the shoulder, in which said terminal portions of the connector means are positioned below said slot, and in which said flexible circuit extends along said bottom surface of the socket below said slot.

8. A combination as claimed in claim 7, in which said shoulder extends from a side of said socket in one direction from said slot, and in which one of said posts extends downwardly from said bottom surface of the socket at a position located in the opposite direction from said slot.

9. A combination as claimed in claim 5, including a plurality of external circuit terminals carried by said socket and having connection regions at one of said surfaces of the shoulder, and in which said flexible circuit includes a plurality of conductor runs respectively mated against said connection regions of the external circuit terminals.

10. A combination as claimed in claim 9, in which said mated conductor runs and connection regions are respectively soldered together.

11. A combination as claimed in claim 9, in which said terminal portions of the connector means and said connection regions of the external circuit terminals are at the same surface of the shoulder.

12. A combination as claimed in claim 1, in which said flexible circuit comprises a sheet-like support member of flexible electrically insulating material and electrical circuitry carried on one side thereof, said flexible circuit being positioned with said one side toward said surfaces and edge of the socket.

13. A combination as claimed in claim 12, including an integrated circuit chip carried on said one side of the sheet-like support member and extending from the surface thereof at a position alongside one of said socket surfaces, and an opening in said one socket surface for accommodating said integrated circuit chip.

14. A combination as claimed in claim 1, in which said openings through the circuit comprise a pair of holes.

* * * * *